United States Patent [19]
Dallabora et al.

[11] Patent Number: 5,917,753
[45] Date of Patent: Jun. 29, 1999

[54] SENSING CIRCUITRY FOR READING AND VERIFYING THE CONTENTS OF ELECTRICALLY PROGRAMMABLE/ ERASABLE NON-VOLATILE MEMORY CELLS

[75] Inventors: Marco Dallabora, Carpiano; Corrado Villa, Sovico; Andrea Ghilardelli, Cinisello Balsamo, all of Italy

[73] Assignee: STMicroelectronics, S.r.l., Agrate Brianza, Italy

[21] Appl. No.: 08/845,916

[22] Filed: Apr. 29, 1997

[30] Foreign Application Priority Data

Apr. 30, 1996 [EP] European Pat. Off. .............. 96830246

[51] Int. Cl.[6] ..................................................... G11C 7/00
[52] U.S. Cl. .................................. 365/185.21; 365/185.2; 365/185.22; 365/207; 365/210
[58] Field of Search ........................ 365/185.21, 185.22, 365/185.2, 207, 210

[56] References Cited

U.S. PATENT DOCUMENTS

| | | | |
|---|---|---|---|
| 5,289,412 | 2/1994 | Frary et al. ............................... | 365/185 |
| 5,386,388 | 1/1995 | Atwood et al. .......................... | 365/201 |
| 5,444,656 | 8/1995 | Bauer et al. ........................ | 365/189.01 |
| 5,654,919 | 8/1997 | Kwon ................................. | 365/185.21 |

FOREIGN PATENT DOCUMENTS 0 678 871 A1  10/1995  European Pat. Off. .
WO 90/12400  10/1990  WIPO .

OTHER PUBLICATIONS

Atsumi, Shigeru, et al., "Fast programmable 256K Read Only Memory with On–Chip Test Circuits," *IEEE Transactions on Electron Devices* ED–32(2):502–507, 1985.

*Primary Examiner*—Do Hyun Yoo
*Attorney, Agent, or Firm*—David V. Carlson; Seed and Berry LLP

[57] ABSTRACT

A sense amplifier circuit for reading and verifying the contents of non-volatile memory cells in a semiconductor integrated device including a memory matrix of electrically programmable and erasable cells. The circuit includes a sense amplifier which has a first input connected to a reference load column incorporating a reference cell, and a second input connected to a second matrix load column incorporating a cell of the memory matrix. The circuit also includes a small matrix of reference cells connected, in parallel with one another, in the reference load column. Also provided is a double current mirror having a first mirror column which is connected to a node in the reference load column connected to the first input, and a second mirror column coupled to the second matrix load column to locally replicate, on the second mirror column, the electric potential at the node during a load equalizing step.

8 Claims, 3 Drawing Sheets

SENSING CIRCUITRY FOR READING AND VERIFYING THE CONTENTS OF ELECTRICALLY PROGRAMMABLE/ERASABLE NON-VOLATILE MEMORY CELLS

FIELD OF THE INVENTION

This invention relates to a sensing circuitry for reading and verifying the contents of electrically programmable/erasable non-volatile memory cells.

BACKGROUND OF THE INVENTION

As is known, read-only memories of the flash type are arranged into cell matrices which are set up as rows, or word lines, and columns, or bit lines.

Each cell comprises a floating gate transistor which has drain and source terminals as well. A floating gate is formed over a semiconductor substrate and isolated therefrom by a thin layer of gate oxide. A control gate is coupled capacitively to the floating gate by means of a dielectric layer, and metallic electrodes are provided to contact the drain, source and control gate in order to have predetermined voltage values applied to the memory cell.

Cells in one word line share the electric line driving their respective control gates, while cells in one bit line have their drain terminals in common.

The state of the memory cells can be sensed, i.e., the information stored therein read, through sensing circuitry.

Circuitry for reading the contents of memory cells in the matrix basically comprises:
  an input stage receiving address signals for a byte or memory word to be read;
  a row/column decode circuit for selecting the byte of the memory cells to be read;
  a read amplifier for sensing the state of the cells in that byte; and
  an output stage on which the information contained in the byte is presented after reading.

Each reading cycle is divided into a number of mutually clocked steps by pulses having a predetermined duration. These pulses are derived from a main pulse, known as an ATD (Address Transition Detection) pulse, which detects transitions in the addresses. The ATD signal is generated internally in the memory device each time that a level transition occurs in one of the memory addresses.

The read step itself will be discussed in detail hereinafter, in relation to the read amplifier that is to sense the states of the memory cells.

As those of skill in this field know well, the read amplifier, also called a sense amplifier, is a differential type which compares the current flowing through a cell in the memory matrix and the current flowing through a reference cell, such as a virgin cell.

For this purpose, the sense amplifier uses two current-voltage conversion blocks I/V for converting analog read data to digital.

FIG. 1 of the accompanying drawings shows a sense amplifier 10 in the process of carrying out an unbalanced load read operation, in a conventional manner.

A first input of the sense amplifier is connected to a load which comprises a reference cell 2, which may be the aforementioned virgin cell, and a second input of the amplifier is connected to a load which comprises a cell 4 of the memory matrix.

In the example shown, there is a conversion block 3 which comprises a current mirror consisting of PMOS transistors, of which one, P1, is connected as a diode configuration in a column 5 of the reference cell and has an aspect ratio W/L which is a mirror ratio n times that of the other transistor, P2, connected in a column 6 of the memory matrix.

The current Irif placed by the reference cell on its column 5 is mirrored at a ratio of 1:n onto the matrix column 6. Depending on the state of the memory cell, a greater or lesser amount of the mirrored current will be drawn by the cell, which causes an unbalance to appear at corresponding connection nodes A and B to the inputs of the sense amplifier, thereby allowing the state of the memory cell to be "read".

For flash memories, the sensing circuitry is to meet stringent requirements, which adds other problems to the sense amplifier read circuit design.

For example, the read circuitry incorporated to EPROM memory devices required a full column of reference cells, one reference cell per row in the matrix of memory cells. In this way, differences between the reference cells and the matrix cells, as due to they being differently located within the device, could be minimized. In some cases, as many as two columns of reference cells were employed.

That approach is unsuitable for flash memory devices, wherein an overly increased number of reference cells should be avoided, not to increase the threshold voltage spread any further.

For matrices of flash cells it is much better if a single reference column is shared by all of the outputs, but then the reference current must be carried to all the sectors, and a relatively wide spread ensured for the threshold voltages in order for the verify operations to be carried out effectively upon erasing and programming.

In addition, the reference column should be low in parasitic capacitance, in order to allow for quick powering up of the sensing circuitry from a standby condition.

Furthermore, dynamic reading requires that the input nodes to the sense amplifier be equalized before a read or a verify operation can be performed.

This equalization step would see, on the one side, a single reference column, and on the other, a set of matrix outputs which may number eight or sixteen, according to the number of the sectors.

A high capacitance would, therefore, be needed of the reference node to avoid dependence of the equalization on pattern.

It will be appreciated that the two last-mentioned stipulations are conflicting ones.

SUMMARY OF THE INVENTION

According to principles of the present invention, sensing circuitry is provided for reading and verifying the contents of memory cells in an integrated memory device having a matrix of non-volatile cells, which sensing circuitry has such constructional features as to allow the aforementioned operations to be carried out with extremely fast access times, in obviation of the drawbacks besetting the prior art.

More particularly, the invention relates to a sense amplifier circuit for reading and verifying the contents of non-volatile memory cells in a semiconductor integrated circuit having an array of electrically programmable and erasable cells in matrix form, the circuit comprising a sense amplifier which has a first input connected to a load column including a reference cell and a second input connected to a second load column including a cell of the memory matrix.

The features and advantages of a circuit according to the invention will be apparent from the following detailed description of an embodiment thereof, given by way of example and not of limitation with reference to the accompanying drawings.

DETAILED DESCRIPTION

Figure 2:
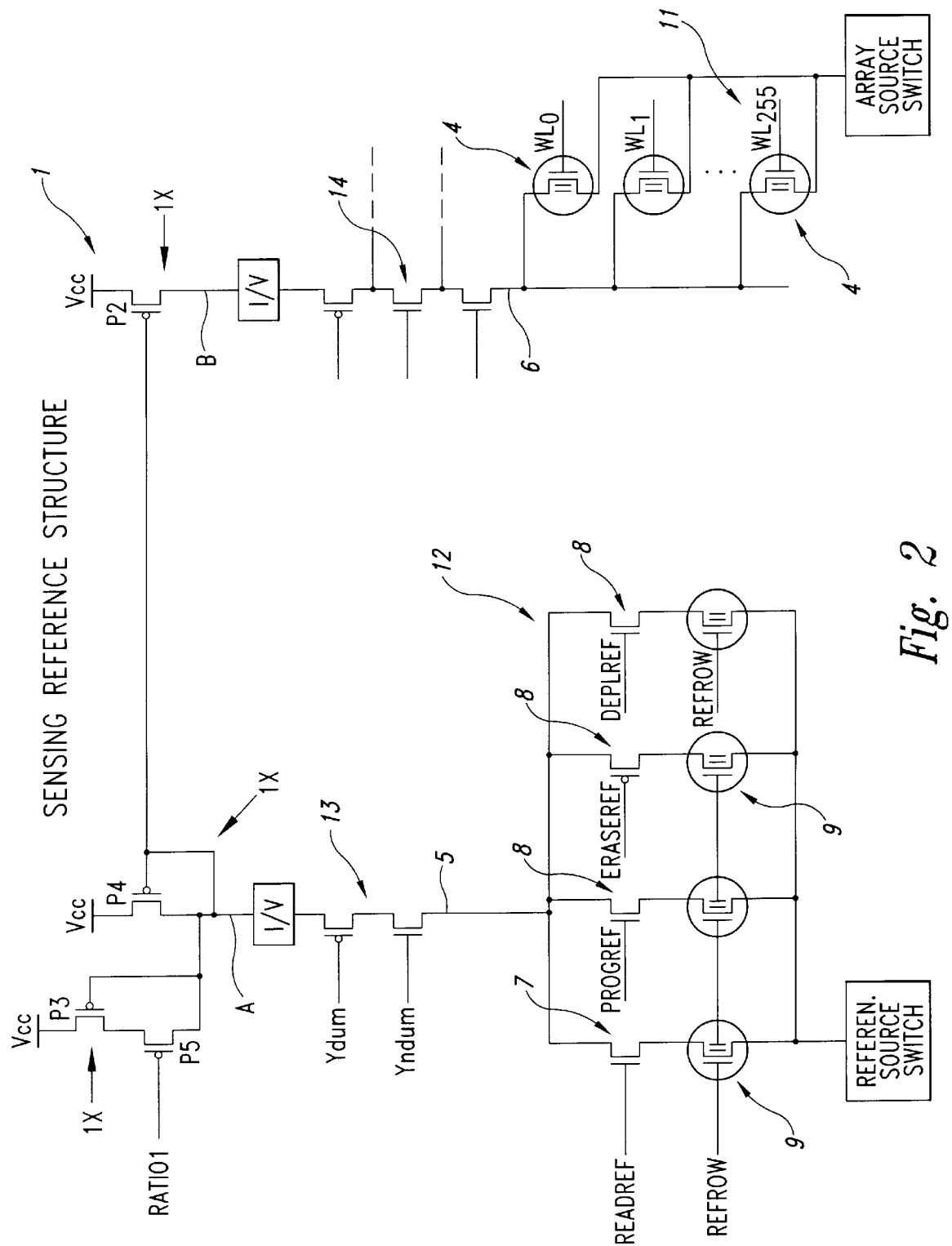
FIG. 2 shows a diagram of a sense amplifier type of read circuit according to an embodiment of this invention.

Referring to FIG. 2, generally and schematically shown at 1 is a sense amplifier circuit for reading and verifying the contents of memory cells.

In particular, the sense amplifier circuit I is intended, according to an embodiment of the invention, for carrying out read and verify operations on the cell contents of a semiconductor non-volatile memory device which is programmable and erasable electrically, e.g., cells of the flash type.

The circuit of the invention is particularly, but not exclusively, intended for a single power supply integrated memory device which comprises a matrix 11 of memory cells 4 with multiple sectors. Each memory cell 4 is comprised of a floating gate MOS transistor having an additional control gate. The memory cells 4 are set up as rows or word lines WL, and columns or bit lines.

The memory cells 4 in one word line share an electric line which drives the respective control gates, while the memory cells 4 in one bit line have their drain terminals in common.

The inventive circuit is particularly, but not solely, intended for a flash memory having a single power supply, at a supply voltage Vdd of 5V. The cell matrix size is of four Mbytes, divided into eight sectors of 512 kbytes each, with memory words of sixteen bits.

The principles of the invention can be better appreciated from a comparison of the prior art solution, as previously discussed in connection with FIG. 1, and the innovative solution described with reference to FIGS. 2 and 3.

Figure 3:
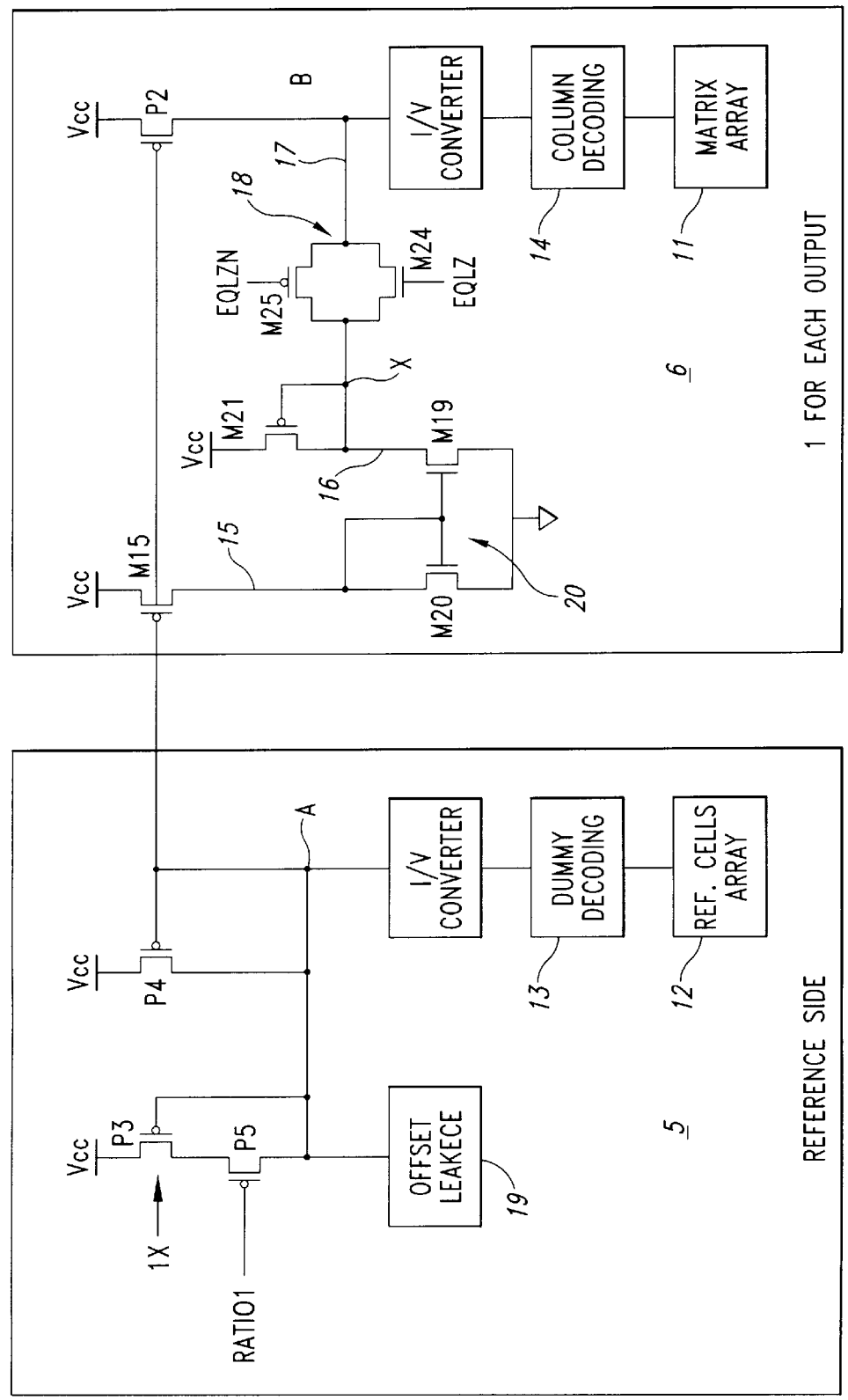
FIG. 3 shows a further diagram of the circuit in FIG. 2, as including an additional circuit portion according to an embodiment of the invention.

A sense amplifier, known per se, is omitted from FIGS. 2 and 3, but its input nodes A and B are shown in a REFSIDE column 5 including at least one reference cell, e.g., a virgin cell, and in a MATSIDE column 6 including one memory cell 4 of the matrix 11.

Since the sense amplifier is also to be used for verify operations whereby a threshold voltage value of the memory cells 4 is checked, a different mirror ratio n from that used during a read step is desirable. The selection of a preferred value for the mirror ratio n will depend on which of two possible states of the memory cell 4, either the state "0" or the state "1", is favored for reading. The circuit design proposed herein allows the most appropriate value of the mirror ratio n to be selected for a particular read or verify step.

It should be considered that there are verify operations of three basic types:

a program verify operation, to check that a memory cell 4 has been programmed correctly;

an erase verify operation, to check that a memory cell 4 has been erased correctly; and a depletion verify operation, to check that the erasing of a memory cell 4 has not been carried out to excess.

Figure 1:
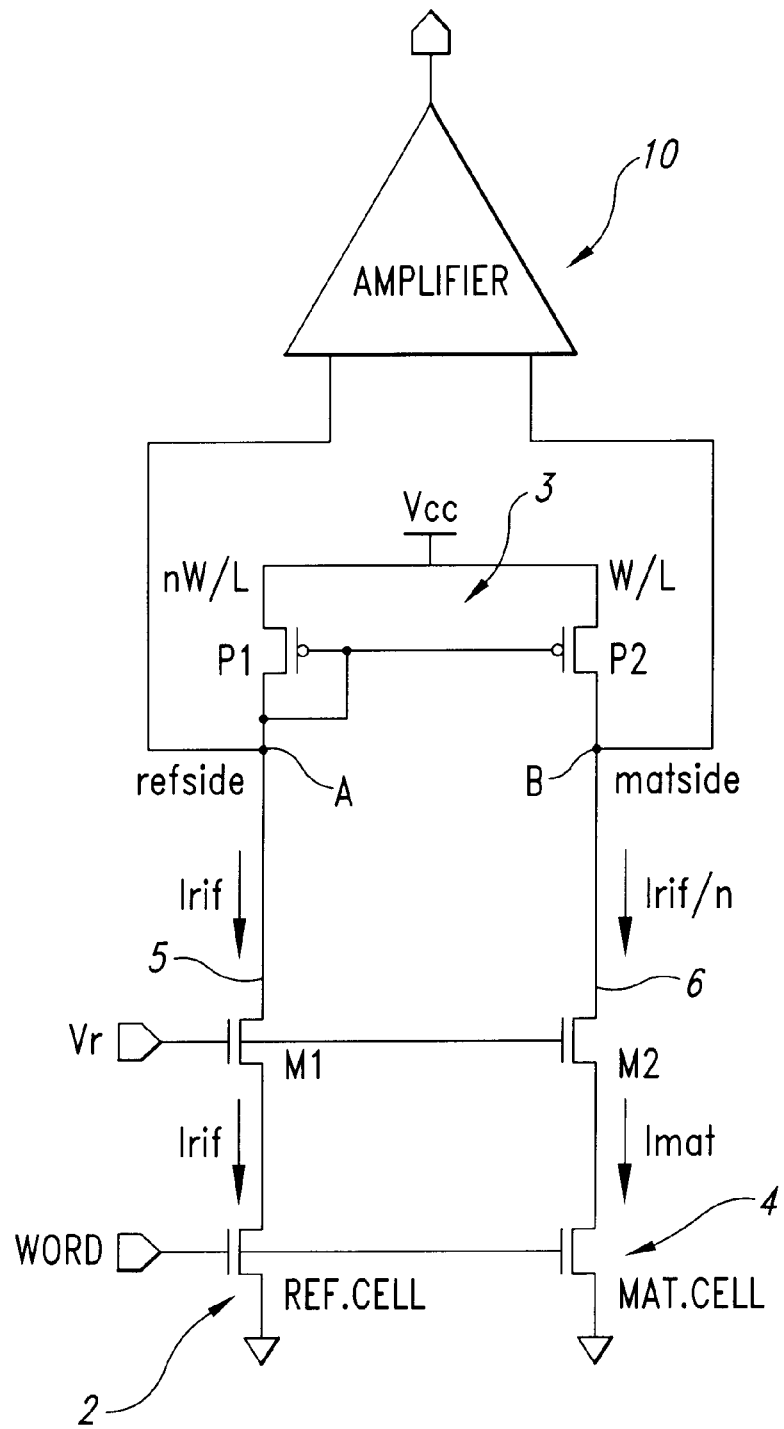
FIG. 1 shows a diagram of a sense amplifier type of read circuit according to the prior art.

For the purpose of this invention, the construction of the PMOS transistor current mirror, shown at 3 in FIG. 1, has been altered in its REFSIDE column 5 side.

As shown in FIG. 2, a transistor pair P3 and P4, both of the PMOS type, are provided in place of the single transistor P1 provided by the solution of FIG. 1. These transistors, P3 and P4, have the same aspect ratio W/L as the transistor P2 in the matrix column.

A third, enable PMOS transistor P5 is connected with its conduction terminals between the source terminal and the gate terminal of the transistor P3.

This transistor P5 receives, on its control terminal, a signal RATIO 1 which, when at a high logic level, will turn off the transistor P5 to enable the current mirror structure to perform a verify operation at a mirror ratio n of 1.

Conversely, when the signal RATIO 1 is at a low logic level, the transistor P5 will be accessed to enable a read operation at a mirror ratio n of 2.

Another important aspect of the invention is the provision of a small matrix 12 of reference cells connected in parallel with one another in the reference column 5.

Preferably, the small matrix 12 only comprises four reference cells. One reference cell 7 is intended for the read operation, while the remaining three reference cells 8 are dedicated for the different types of verify operations, namely: the program verify, erase verify, and depletion verify operations.

Associated serially with each reference cell 7 or 8 of the small matrix 12 is a corresponding selection transistor 9. A simple encode operation, tied to the type of the read or verify operation to be carried out, allows a reference cell 7 or 8 to be selected for use. All this is made possible by a suitable signal being received on the control terminal of one of the corresponding selection transistors 9.

The supply of power to the reference cells 7 or 8 is generated internally of the sensing circuitry through a suitable charge pump.

Connected serially in the REFSIDE column 5 are decoding dummy transistors 13 of the NMOS type, and similar column-decoding NMOS transistors 14 are provided in the MATSIDE column 6.

It will be appreciated from the foregoing description that the solution proposed by the present invention does achieve flexibility of a higher degree than prior solutions, in that the small matrix 12 of reference cells 7 and 8 allows one of the parallel connected reference cells 7 or 8 to be selected as required for sensing.

An equalization sequence is preferably carried out in order to reduce the access time for reading the cells of the memory matrix.

Briefly, since the read operation is carried out by virtue of an unbalance in the columns 5 and 6, it would be convenient if the connection node to the inputs of the sense amplifier can be equalized somewhat ahead of performing the reading.

This equalization would allow the next unbalance of the loads to be more effective, by a reduction in wait time, that is by ensuring faster access times.

An equalization of the two nodes A and B could be obtained by merely shorting the nodes A and B together.

However, since the solution proposed by the present invention provides a single reference column 5 for all the outputs, it is important that this equalization step should not affect the node A in the REFSIDE column 5.

To this aim, a double current mirror 20 is provided, as shown in FIG. 3, which comprises a first pair of PMOS transistors, M15 and M21, and a second pair of NMOS transistors, M20 and M19. The transistors M15 and M20 form a first column 15, while the transistors M21 and M19 form a second column 16.

The transistors M15 and M21 are the same size as the transistors P3 and P4.

The drain terminals of the transistors M15 and M21 are connected to a power supply Vcc. The control terminal of the transistor M15 is connected to the control terminals of the transistors P2 and P4.

The control terminal of the transistor M21 forms a node X with the source terminal thereof, and is connected to the MATSIDE column 6 by a connection path 17 in which is a pass-transistor block 18 comprising transistors M24 and M25. The control terminals of the transistors M24 and M25 receive respective equalization control signals, EQLZ and EQLZN.

The second pair of NMOS transistors, M20 and M19, form a conventional current mirror, with the respective source terminals connected to ground.

The current flowing through each of the two columns 15 and 16 of the double current mirror 20 is half of a reference current Irif flowing through the REFSIDE column 5. With the block 18 turned off by the signal EQLZ, the electric potential at the node X is the same as that at the node A in the REFSIDE column 5.

Accordingly, the node A will not be used to perform an equalization of the sense amplifier input nodes A and B, but rather its local replicated node X will. The equalization is performed locally for each output, i.e., for each sector of the matrix 11.

There are eight replicas of the node X, one for each output corresponding to a sector in the matrix 11 of memory cells 4.

In this way, an equalization can be obtained which involves no change in the electric potential at the node A and provides a correct data reading already before the equalization step is completed.

Advantageously, a leaker 19 is further provided in the REFSIDE column 5 which is connected in parallel with the node A to generate a small offset current on the order of a few microamperes.

In a standby condition, wherein everything is turned off and the cells cannot bias the nodes A and B, the node A may attain a voltage equal to the power supply Vcc due to current leakage. This is on account of the parasitic capacitance seen from the REFSIDE column 5.

By providing the leaker 19, leakage current can be dumped groundwards.

Changes and modifications may be made unto the inventive sensing circuitry without departing from the invention scope as defined in the appended claims.

We claim:

1. A sense amplifier circuit for reading and verifying the contents of non-volatile memory cells in a semiconductor integrated device including a memory matrix of electrically programmable and erasable memory cells, the sense amplifier circuit comprising:

a sense amplifier having a first input connected to a reference load column and a second input connected to a matrix load column, the matrix load column including at least one memory cell of the memory matrix;

a matrix of reference cells coupled to the reference load column, the reference cells being connected in parallel with each other;

a selection transistor connected in series with each reference cell in the matrix of reference cells, each reference cell being selected by rendering a respective one of the selection transistors conductive; and a current mirror circuit connected between the reference load column and the matrix load column, the current mirror circuit comprising a first mirror transistor in the matrix load column and a pair of mirror transistors in the reference load column, the pair of mirror transistors being coupled in parallel to the first mirror transistor and wherein each transistor in the pair of mirror transistors has the same aspect ratio as the first mirror transistor.

2. The sense amplifier circuit of claim 1, further comprising an enabling transistor connected to the pair of mirror transistors, the enabling transistor being coupled to receive a mirror ratio signal at a control terminal, the enabling transistor being structured to select a mirror ratio of the current mirror circuit in response to the mirror ratio signal.

3. The sense amplifier circuit of claim 1, further comprising a double current mirror circuit coupled between the first and second inputs of the sense amplifier, the double current mirror circuit being structured to generate a node voltage substantially equal to a voltage at the first input of the sense amplifier and being structured to equalize the reference load column with the matrix load column based on the node voltage.

4. The sense amplifier circuit of claim 3, further comprising a leaker circuit connected to the first input of the sense amplifier, the leaker circuit being structured to generate an offset current.

5. A sense amplifier circuit for reading and verifying the contents of non-volatile memory cells in a semiconductor integrated device including a matrix of electrically programmable and erasable cells, said sense amplifier circuit comprising a sense amplifier having a first input connected to a reference load column incorporating a reference cell, a second input connected to a matrix load column incorporating a cell of the matrix, and a small matrix of reference cells connected, in parallel with one another, in the reference load column, said reference and matrix load columns being connected to each other through a current mirror circuit comprising a transistor in the matrix load column and a pair of transistors in the reference load column, each of the transistors in the pair of transistors having the same aspect ratio as the transistor in the matrix load column.

6. A sense amplifier circuit according to claim 5 wherein said small matrix comprises a set of reference cells of which one is intended for a read operation, and the remaining reference cells are intended for different types of verifying operations.

7. A sense amplifier circuit according to claim 5, further comprising a selection transistor associated serially with each reference cell in the small matrix, each selection transistor being structured to select a reference cell for use by an encode operation.

8. A sense amplifier circuit according to claim 5 wherein said current mirror circuit further comprises an additional enable transistor having conduction terminals connected between said pair of transistors and being structured to receive, on a control terminal, a signal to change a mirror ratio of the current mirror circuit.

* * * * *